United States Patent [19]
Zametzer et al.

[11] Patent Number: 5,194,825
[45] Date of Patent: Mar. 16, 1993

[54] PROTECTIVE CIRCUIT FOR THE INPUT TRANSISTOR OF A RECEPTION AMPLIFIER IN NUCLEAR MAGNETIC RESONANCE SYSTEMS

[75] Inventors: Klaus Zametzer, Forchheim; Markus Vester, Erlangen, both of Fed. Rep. of Germany

[73] Assignee: Siemens Aktiengesellschaft, Munich, Fed. Rep. of Germany

[21] Appl. No.: 736,645

[22] Filed: Jul. 26, 1991

[30] Foreign Application Priority Data

Jul. 30, 1990 [DE] Fed. Rep. of Germany ....... 4024165

[51] Int. Cl.⁵ ............................................. H03F 1/52
[52] U.S. Cl. ..................................... 330/298; 324/322
[58] Field of Search ................. 330/207 P, 296, 298, 330/136, 195, 204; 324/311, 322; 361/111, 119; 455/82–84

[56] References Cited

U.S. PATENT DOCUMENTS 2,939,949  6/1960  Curtis ..................................... 455/82
2,993,128  7/1961  Carroll .
4,764,726  8/1988  Misic et al. .......................... 324/322

OTHER PUBLICATIONS

D. I. Hoult, The NMR Receiver: A Description and Analysis of Design, Progress in NMR Spectroscopy, vol. 12 pp. 49–51 (1978).

Primary Examiner—James B. Mullins

[57] ABSTRACT

A reception amplifier in a nuclear magnetic resonance system includes an input transistor. The base of the input transistor is connected to a protective circuit. The protective circuit shifts the voltage at the base-emitter path of the input transistor into the inhibit range only during a high-frequency transmission pulse. The voltage is produced by rectification of a fraction of the high-frequency transmission pulse. The protective circuit of the reception pre-amplifier prevents the input transistor from being gradually destroyed by an excessive base current during the transmission when voltage peaks are provided at the input.

6 Claims, 1 Drawing Sheet

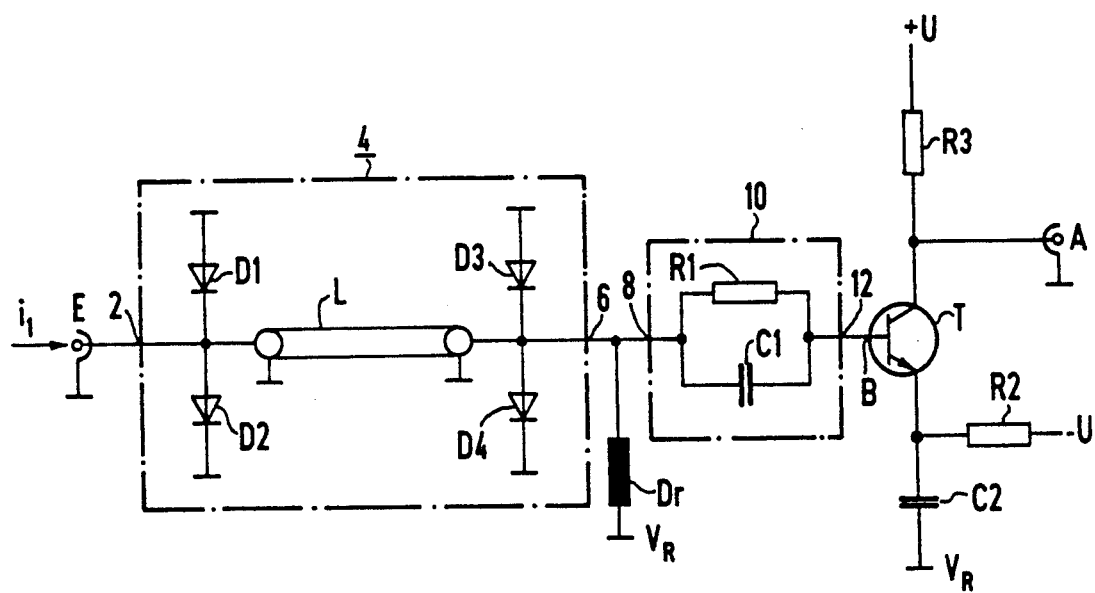

PROTECTIVE CIRCUIT FOR THE INPUT TRANSISTOR OF A RECEPTION AMPLIFIER IN NUCLEAR MAGNETIC RESONANCE SYSTEMS

BACKGROUND OF THE INVENTION

1. Field of the Invention

The present invention relates to a reception amplifier in a nuclear magnetic resonance system having an input transistor.

2. Description of the Prior Art

In nuclear magnetic resonance systems, a relatively high-power transmission pulse is forwarded by a transmission-reception diplexer to a transmission antenna. The transmission antenna also receives reception signals that are smaller than the high-power transmission pulse by orders of magnitude, and the reception signals are transmitted to a reception amplifier by the transmission-reception diplexer. However, a complete electrical separation of the reception amplifier during the transmission event is not possible because of the unavoidable switching capacitances in the transmission-reception diplexer. As a result, residues of the transmission signal proceed, by means of the transmission-reception diplexer, to the reception receiver. Previously, the reception amplifier had to be provided with field effect input transistors that have a high input impedance. As field effect transistors (FET's) are not sensitive to the currents arising from the transmission signal, only the reception signals are received by the reception amplifier. However, amplifier stages having FET's can only process relatively narrow-band signals.

Further, when a single broadband pre-amplifier is used to replace the various, narrowband reception amplifiers, a bipolar transistor must be used as an input transistor. However, due to the low input impedance of bipolar transistors, bipolar transistors can be gradually destroyed due to repeated exposure of the bipolar transistors to the current peaks arising from the transmitter.

SUMMARY OF THE INVENTION

The object of the present invention is to provide a protective circuit for the input transistor of a reception pre-amplifier in a nuclear magnetic resonance system. The protective circuit prevents the input transistor from being gradually destroyed by an excessively high base current during transmission, given voltage peaks at the input.

The above object is inventively achieved in a high-frequency input amplifier element, such as a transistor, having a control input, i.e., the base of the transistor, connected to a protective circuit. The protective circuit shifts the voltage at the controlled (base-emitter) path of the input transistor into the inhibit region only during a high-frequency transmission pulse, the voltage being produced by rectification of a fraction of the high-frequency transmission pulses. The inhibit bias reliably prevents the input transistor from being destroyed by an excessively high base current. Because the voltage is produced from the high-frequency transmission pulse by rectification, the need for a switch that applies the voltage to the base-emitter path only during the transmission event is eliminated.

In an advantageous embodiment of the reception pre-amplifier of the present invention, the protective circuit includes a capacitor connected in parallel to a resistor to form a parallel circuit, where the parallel circuit is disposed between the base and the input of the reception amplifier. The base-emitter path can be used as a rectifier diode in order to charge the capacitor of the protective circuit. Because the capacitor is disposed in the base circuit of the transistor, it can have a relatively low capacitance, such that the input transistor is not gradually destroyed by the one-time charging current. The capacitor is discharged by the resistor following the transmission event.

In another advantageous embodiment of the reception amplifier of the present invention, a voltage limiting circuit is disposed between the input of the reception amplifier and the protective circuit. The voltage limiting circuit prevents extremely high-power transmission pulses on the order of magnitude of, for example, 15 kW, from destroying the input transistor.

In yet another advantageous embodiment of the reception amplifier of the present invention, two diodes are connected in parallel, and respectively disposed in a shunt arm at an input and an output of the voltage limiting circuit. A conductor piece having a length that is shorter than $\frac{1}{4}$ of the wavelength of a signal on the conductor is disposed between the input and the output of the voltage limiting circuit in a longitudinal arm. As a result, power peaks at the input of, for example, 1 A can be eliminated. By matching the intervening conductor section, reflections between the input of the reception amplifier and the antenna are eliminated.

BRIEF DESCRIPTION OF THE DRAWINGS

The FIGURE is a schematic circuit diagram of a reception amplifier embodying the principles of the present invention.

DETAILED DESCRIPTION OF THE PREFERRED EMBODIMENTS

The FIGURE illustrates a reception amplifier having a protective circuit preceding the reception amplifier, and a voltage limiting circuit preceding the protective circuit.

In the FIGURE, an input E of the reception amplifier for a nuclear magnetic resonance system is connected to an input 2 of a voltage limiting circuit 4. An output 6 of the voltage limiting circuit 4 is connected to an input 8 of a protective circuit 10, and an output 12 of the protective circuit 10 is connected to a base B of a bipolar input transistor T. One example of such an input transistor T is an npn transistor. The voltage limiting circuit 4 and the protective circuit 10 are connected in series. Serially connecting these elements is particularly suitable for protecting the transistor T when high-power pulses, such as 15 kW pulses, are transmitted. The voltage limiting circuit 4 can be eliminated when reduced transmission power or smaller switching capacitances in the transmission-reception diplexer are provided. The input 8 of the protective circuit 10 is then directly connected to the input E of the reception amplifier. The signal amplified by the transistor T is transmitted to the second stage in the reception amplifier at an output A.

The operating point of the transistor T is set by a resistor R2 in the emitter branch, a resistor R3 in the collector circuit of the transistor T, an inductor Dr between the input 8 and the reference potential and the two DC voltage sources $+U$ and $-U$. Further, the emitter of the transistor T is connected to the reference potential $V_R$ by means of the capacitor C2. The capacitance of the capacitor C2 is selected as high as possible, as every resistor between the emitter of the transistor T and the reference potential $V_R$ reduces the steepness of the transistor T.

Referring to the voltage limiting circuit 4, two diodes D1 and D2 are connected anti-parallel in series as a first limiter between the input 2 and the reference potential $V_R$. A second limiter between the output 6 and the reference potential $V_R$ is formed by the diodes D3 and D4, also in series. Further, a short conductor L acting as a series of inductance is disposed between the input 2 and the output 6. The characteristic impedance of the conductor section L is matched to the intrinsic impedance of the antenna, and amounts to, for example, $Z_0 = 50$ ohms. In order to act as an inductance, the conductor section L must be made shorter than one-fourth of the wavelength of a signal on the conductor section L. The inductance is then proportional to the length of the conductor section L.

The protective circuit 10 includes a parallel circuit having a capacitor C1 and a resistor R1. The parallel circuit is connected between the input 8 and the output 12 of the protective circuit 10. As the capacitor C1 is arranged in the base circuit, the capacitor C1 can be selected to have a relatively small capacitance, so that it approximately represents a reactance having the magnitude of the intrinsic impedance for the transmission frequency.

The voltage limiting circuit 4 diverts a power peak $i_1$ of, for example, 1 A produced across the transmitter and the reference potential $V_R$ by means of the diodes D1 and D2. The residual voltage is further reduced by the voltage division of the conductor section L acting, as series inductance, and by the anti-parallel diodes D3 and D4. The small voltage peaks that appear at diodes D3 and D4, however, would gradually destroy the input transistor T because of the excessively high base current, absent an intervening protective circuit 10.

Further, the small residual voltage remaining at the anti-parallel diodes D3 and D4 in the transmission case, cause the capacitor C1 and the capacitor C2 to be gradually charged once, by means of the diode of the base-emitter path of the transistor T, to a positive voltage with reference to the reference potential $V_R$ when the transistor T is a npn transistor. The capacitance of the capacitor C1 is smaller than the capacitance of the capacitor C2 by 10 to 15 times. As a result, the capacitor C1 dissolves most of the small residual voltage. The voltage thus prevents further voltage peaks from causing a current in the base B of the transistor T. The operating point of the base B of the transistor T is negatively shifted into the inhibit region as a result of the rectification during the transmission pulse, so that only an extremely short, harmless current peak at the beginning of the transmission pulse is transmitted.

The reception signal, on the other hand, is not deteriorated by the protective circuit 10. The resistor R1 discharges the capacitor C1 in the time between the end of the transmission pulse and the beginning of the reception phase. Base currents produced by the reception signal are orders of magnitude smaller than the quiescent base current in the transistor T. For example, the base currents produced by the reception signal are in the of $\mu$A range where the quiescent base current lies in the of mA range. The operating point for the base-emitter path is predetermined by selecting the resistor R2 and the supply voltage $-U$ such that rectification does not occur for the reception signals.

Although the present invention has been described with reference to a specific embodiment, those of skill in the art will recognize that changes may be made thereto without departing from the scope and spirit of the invention as set forth in the appended claims.

We claim:

1. A reception amplifier in a nuclear magnetic resonance system, comprising:
   a high-frequency input amplifying and rectifying element having a control input and a controlled path; and
   protective circuit means, connected to said control input of said high-frequency input amplifying and rectifying element by said controlled path, for shifting a voltage across said controlled path of said high-frequency input amplifying and rectifying element into an inhibit range for said amplifying and rectifying element only during a high-frequency transmission pulse, wherein said voltage is produced by rectifying a portion of said high-frequency transmission pulse.

2. A reception amplifier according to claim 1, said protective circuit means further comprising:
   a parallel circuit including a capacitor and a resistor, said parallel circuit being arranged between said control input of said amplifying and rectifying element and an input of said reception amplifier.

3. A reception amplifier according to claim 1, further comprising:
   a voltage limiting circuit disposed between said input of said reception amplifier and said protective circuit means.

4. A reception amplifier according to claim 3, further comprising:
   a plurality of pairs of diodes connected anti-parallel, respectively arranged in a shunt arm at an input and an output of said voltage limiting circuit;
   and a conductor piece having a length of less than one-fourth of the wavelength of a signal on said conductor arranged in a longitudinal arm disposed between said input and said output.

5. A reception amplifier according to claim 1, wherein said high-frequency input amplifying and rectifying element is a high-frequency transistor having a base, said base providing said controlled input, and a base-emitter path of said high-frequency transistor providing said controlled path.

6. A reception amplifier according to claim 5, wherein said base-emitter path is used to rectify a portion of said high-frequency transmission pulse.

* * * * *